(12) United States Patent
Forbes et al.

(10) Patent No.: US 6,304,505 B1
(45) Date of Patent: Oct. 16, 2001

(54) DIFFERENTIAL CORRELATED DOUBLE SAMPLING DRAM SENSE AMPLIFIER

(75) Inventors: Leonard Forbes, Corvallis, OR (US); Brent Keeth, Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/576,445

(22) Filed: May 22, 2000

(51) Int. Cl.[7] .................................................. G11C 7/00
(52) U.S. Cl. ........................ 365/205; 365/202; 365/207
(58) Field of Search ................................... 365/205, 207, 365/202, 203, 189.06

(56) References Cited

U.S. PATENT DOCUMENTS

| | | | |
|---|---|---|---|
| 3,781,574 | 12/1973 | White et al. ........................ | 307/304 |
| 4,287,441 | 9/1981 | Smith .................................. | 307/353 |
| 5,615,161 | * 3/1997 | Mu ...................................... | 365/208 |
| 5,650,971 | * 7/1997 | Longway et al. ................... | 365/207 |
| 5,838,176 | 11/1998 | Delbruck et al. .................... | 327/95 |
| 5,872,736 | * 2/1999 | Keeth ............................. | 365/189.05 |
| 5,903,502 | 5/1999 | Porter ................................. | 365/201 |

OTHER PUBLICATIONS

Blalock, T.N., "A High–Speed Sensing Scheme for 1T Dynamic RAM's Utilizing the Clamped Bit–Line Sense Amplifier", IEEE Journal of Solid–State Circuits, vol., 27, No. 4, Apr. 1996.

Kuge, Shigehiro et al., "SOI–DRAM Circuit Technologies for Low Power High Speed Multigiga Scale Memories", IEEE Journal of Solid–State Circuit, vol. 31, No. 4, Apr. 1996.

Suma, Katsuhiro et al., "An SOI–DRAM with Wide Operating Voltage Range by CMOS/SIMOX Technology", IEEE Journal of Solid–State Circuits, vol. 29, No. 11, Nov. 1994.

* cited by examiner

Primary Examiner—Viet Q. Nguyen
Assistant Examiner—Hien Nguyen
(74) Attorney, Agent, or Firm—Dickstein Shapiro Morin & Oshinsky LLP

(57) ABSTRACT

A correlated double sampling sense amplifier for a DRAM device that compensates for initial offsets caused by mismatches in transistors used for sensing the data on the bit lines is disclosed. A capacitor is provided between each digit line and an amplifier circuit. A first sampling of the digit lines is made before the memory cell transistor is turned on and the charge from the memory bit capacitor transferred to the digit lines. During the first sampling time, the capacitors between the amplifier circuit and digit lines store the charge on the pre-charged digit lines. The memory cell transistor is then turned on and the charge from the memory bit capacitor transferred to the digit lines. The output signal from the memory cell to the amplifier circuit will appear as the magnitude of the change of the voltage on the capacitors, typically Vcc/2. This double sampling sense amplifier is immune to initial mismatches and offsets since it samples before and after the signal from the memory cell is added to the digit lines.

48 Claims, 6 Drawing Sheets

DIFFERENTIAL CORRELATED DOUBLE SAMPLING DRAM SENSE AMPLIFIER

BACKGROUND OF THE INVENTION

1. Field of the Invention

The present invention relates generally to a semiconductor memory device and, more particularly, to a differential correlated double sampling sense amplifier for use in a DRAM semiconductor device.

2. Description of the Related Art

An increasing number of electronic equipment and electronic-based systems require some form of high-speed memory devices for storing and retrieving information (or "data"). While the types of such memory devices vary widely, semiconductor memory devices are most commonly used in memory applications requiring implementation in a relatively small area. Within this class of semiconductor memory devices, the DRAM (Dynamic Random Access Memory) is one of the more commonly used types.

The DRAM has memory arrays consisting of a number of intersecting row and column lines of individual transistors or memory cells. In a conventional dynamic random access memory (DRAM) device each memory cell, or memory bit, consists of one transistor and one capacitor. A terminal of the transistor is connected to a digit line, or bitline, of the memory device. Another terminal of the transistor is connected to a terminal of the capacitor and the gate terminal of the transistor is connected to a wordline of the memory device. The transistor thus acts as a gate between the digit line and the capacitor.

The second terminal of the capacitor is connected to a voltage rail which carries a voltage, such as Vcc/2. Thus, when the wordline for a particular cell is active, the gate transistor is in a conducting state and the capacitor is connected to the digit line. The capacitor stores a charge that, depending on whether the capacitor is charged or discharged, represents either a logic high or a logic low value.

Typically, a microcomputer circuit selects (or activates) particular row and column lines to access selected memory cells. "Access" typically refers to reading data from or writing data to selected memory cells. Reading data from the memory cells involves the use of a sense amplifier to detect whether the voltage level stored in the memory cell represents a binary one (logic high) or a binary zero (logic low).

Memory devices are typically constructed with complementary digit lines of equal capacitance. Sense amplifiers are connected between the digit lines and operate to sense the differential voltage across the digit lines. Before a memory cell is selected for access, the complementary digit lines must be equilibrated to minimize the cell access time. Equilibration circuits typically short the complementary digit lines together, resulting in an equilibrate voltage equal to the voltage midpoint between the two equal capacitance and logically opposite digit lines. Conventionally, a DRAM contains one sense amplifier for a designated group (row or column) of memory cells. If the voltage level stored in the memory cell represents a binary zero, one of the digit lines will increase in level., typically to a supply voltage Vcc, and the other digit line will decrease in level, typically to a ground level. If the voltage level stored in the selected memory cell corresponds to a binary one, a change in the opposite direction occurs. Through this complementary operation, the sense amplifier yields a single output signal which is coupled through an output buffer to an output pin of the DRAM device.

FIG. 1 illustrates a sense amplifier 10 and related circuitry of a DRAM device having a first array ARRAY0 20 and a second array ARRAY1 22, each of which comprises a plurality of memory cells 21 (shown in ARRAY0 20). A sense amplifier 10 senses charge stored in the selected memory cell of the selected array 20, 22 via a voltage differential on the pair of digit lines D0 24 and D0* 26. One of the arrays 20, 22 is selected by application of signals ISOa and ISOb to transistors 32a, 32b and 34a, 34b, respectively. Thus, when ISOa is driven to a logic high value and ISOb is driven to a logic low value, transistors 32a and 32b become conductive, i.e., turn on, to connect ARRAY0 20 to sense amplifier 10 while transistors 34a and 34b do not conduct, i.e., turn off, to isolate ARRAY1 22 from sense amplifier 10. When ISOa is driven to a logic low value and ISOb is driven to a logic high value, transistors 34a and 34b turn on to connect ARRAY1 22 to sense amplifier 10 while transistors 32a and 32b turn off to isolate ARRAY0 20 from sense amplifier 10.

To minimize the cell access time, equilibration circuits 50a and 50b are provided. Equilibration circuit 50a includes transistor 54 with a first source/drain region coupled to digit line D0 24, a second source/drain region coupled to digit line D0* 26 and a gate coupled to receive an equilibration signal EQa. Equilibration circuit 50a further includes first and second transistors 56 and 58. Transistor 56 includes a first source/drain region that is coupled to digit line D0 24, a gate that is coupled to receive the equilibration signal EQa and a second source/drain region that is coupled to receive an equilibration, voltage Veq, which is typically equal to Vcc/2. Second transistor 58 includes a first source/drain region that is coupled to digit line D0* 26, a gate that is coupled to receive the equilibration signal EQa and a second source/drain region that is coupled to the equilibration voltage Veq. When the signal EQa is at a high logic level, equilibration circuit 50a effectively shorts digit line D0 24 to digit line D0* 26 such that both lines are equilibrated to the voltage Veq. Equilibration circuit 50b is constructed in a similar manner to equilibration circuit 50a and operates when the EQb signal is at a high logic level.

When sense amplifier 10 has sensed the differential voltage across the digit lines D0 24 and DO*26, a signal representing the charge stored in the accessed memory cell is output from the DRAM device on the input/output (I/O) lines I/O 36 and I/O* 38 by connecting the I/O lines I/O 36 and I/O* 38 to the digit lines D0 24 and D0* 26, respectively. A column select (CSEL) signal is applied to transistors 40, 42 to turn them on and connect the digit lines D0 24 and D0* 26 to the I/O lines I/O 36 and I/O* 38.

FIG. 2 illustrates the sense amplifier block 10 of FIG. 1. A typical sense amplifier includes a P-sense amplifier 70 and an N-sense amplifier 80. These amplifiers work together to detect the access signal voltage and drive the digit lines D0 24 and D0* 26 to Vcc and ground accordingly. As shown in FIG. 2, the N-sense amplifier 80 consists of cross-coupled NMOS transistors 82, 84 and drives the low potential digit line to ground. Similarly, the P-sense amplifier 70 consists of cross-coupled PMOS transistors 72, 74 and drives the high potential digit line to Vcc. The NMOS pair 82, 84 or N-sense-amp common node is labeled NLAT* (for N-sense-amp LATch). Similarly, the P-scnse-amp 70 common node is labeled ACT (for ACTive pull-up). Initially, NLAT* is biased to Vcc/2 and ACT is biased to ground. Since the digit line pair D0 24 and D0* 26 are both initially at Vcc/2 volts, the Nsense-amp transistors 82, 84 remain off due to zero Vgs potential. Similarly, both P-sense-amp transistors 72, 74 remain off due to their negative Vgs potential. As discussed in the preceding paragraph, a signal voltage develops between the digit line pair 24, 26 when the memoir cell access occurs. While one digit line contains charge from the cell access, the other digit line serves as a reference for the sensing operation. The sense amplifier firing generally occurs sequentially rather than concurrently. The N-sense-amp 80 fires first and the P-sense-amp 70 second. Dropping the NLAT* signal toward ground will fire the N-sense-amp 80. As the voltage between NLAT* and the digit lines approaches Vth, the NMOS transistor whose gate connection is to the higher voltage digit line will begin to conduct. Conduction results in the discharge of the low voltage digit line toward the NLAT* voltage. Ultimately, NLAT* will reach ground, bringing the digit line with it. Note that the other NMOS transistor will not conduct since its gate voltage derives from the low voltage digit line, which is discharging toward ground.

Shortly after the N-sense-amp 80 fires, ACT will be driven toward Vcc. This activates the P-sense-amp 70 that operates in a complementary fashion to the N-sense-amp 80. With the low voltage digit line approaching ground, a strong signal exists to drive the appropriate PMOS transistor into conduction. This will charge the high voltage digit line toward ACT, ultimately reaching Vcc. Since the memory bit transistor remains on during sensing, the memory bit capacitor will charge to the NLAT* or ACT voltage level. The voltage, and hence charge, which the memory bit capacitor held prior to accessing will restore a fill level, i.e., Vcc for a logic one and GND for a logic zero.

There are potential problems, however, with the sense amplifier circuit 10 as illustrated in FIG. 2. For example, when the sense amplifier circuit 10 is first connected to ground and the bias power supply, an offset can exist at the output nodes due to mismatches in transistor threshold voltages, device sizes, drain conductance and transconductance of transistors 72, 74 and 82, 84. This offset can be reflected back into the input as an input offset, and will add to any mismatch of offset in the pre-charge voltages. In application as a DRAM sense amplifier, the signal on the digit lines must be much larger than this offset to provide accurate sensing of the signal representing the charge stored in the memory bit capacitor.

As device dimensions become smaller and smaller it becomes more and more difficult to achieve matching characteristics of transistors 72, 74, 82 and 84 due to larger variations in threshold voltages caused by number fluctuations in impurity dopings, larger variations in drain conductance and percentage variations in device dimensions. In addition, the use of lower power supply voltages means lower digit line signals. Consequently, it becomes more and more difficult to accurately detect digit line data using conventional techlliclues.

SUMMARY OF THE INVENTION

The present invention alleviates the problems associated with the prior art and provides a differential double correlated DRAM sense amplifier.

In accordance with the present invention, a correlated double sampling sense amplifier for a DRAM device is provided that compensates for initial offsets caused by mismatches in transistors used for sensing the data on the bit lines. A capacitor is provided between each digit line and the amplifier circuit. A first sampling of the signal on the digit lines is made before the memory cell transistor is turned on and the charge from the memory bit capacitor transferred to the digit lines. During the first sampling time, the capacitors between the amplifier circuit and digit lines store the charge on the pre-charged digit lines. The memory cell transistor is then turned on and the charge from the memory bit capacitor transferred to the digit lines. The output signal from the memory cell to the amplifier circuit will appear as the magnitude of the change of the voltage on the capacitors, typically Vcc/2. This double sampling sense amplifier is immune to initial mismatches and offsets since it samples before and after the signal from the memory cell is added to the digit lines.

These and other advantages and features of the invention will become more readily apparent from the following detailed description of the invention which is provided in connection with the accompanying drawings.

DETAILED DESCRIPTION OF THE PREFERRED EMBODIMENTS

Figure 1:
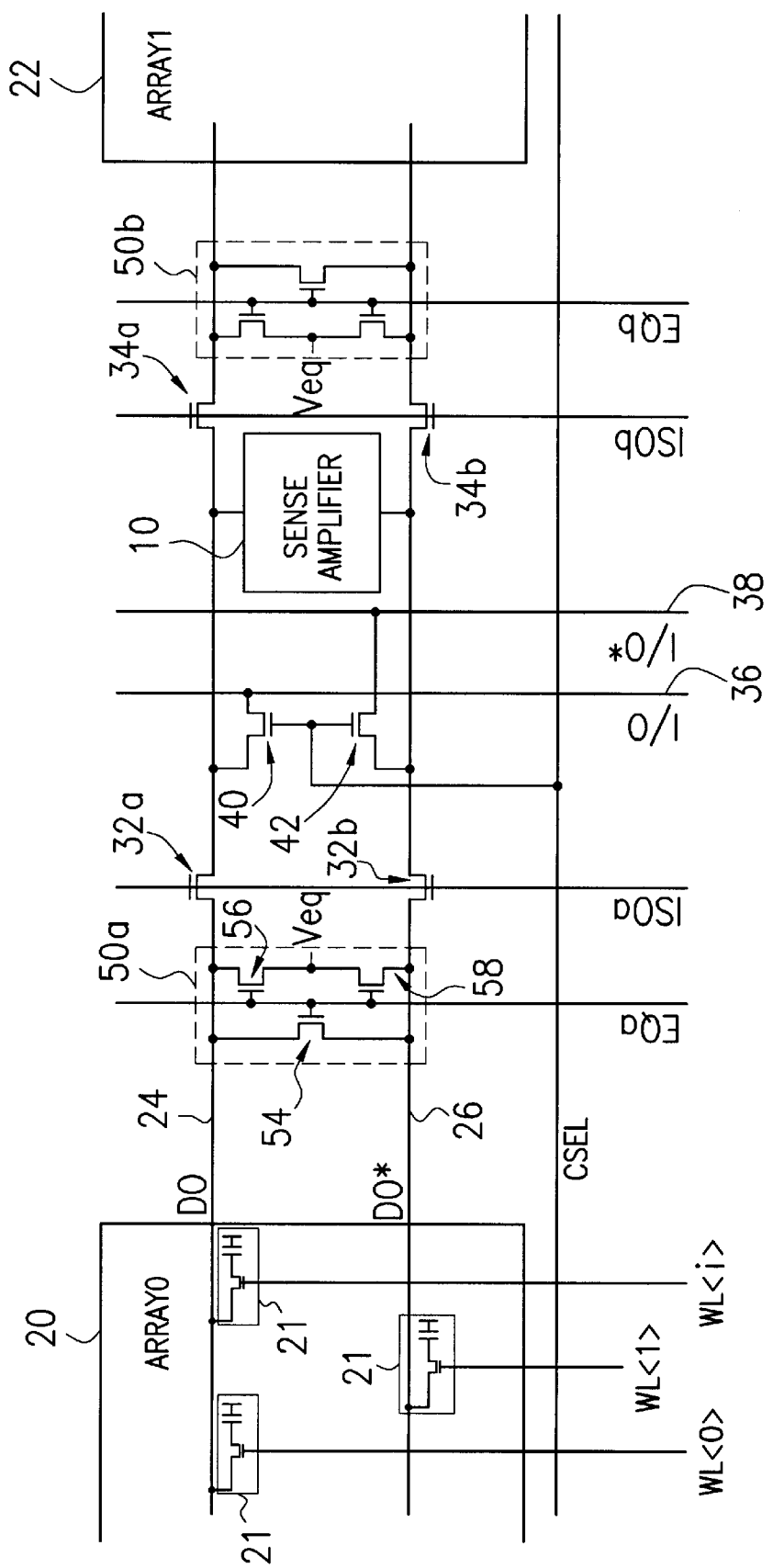
FIG. 1 illustrates a portion of a DRAM device.
Figure 2:
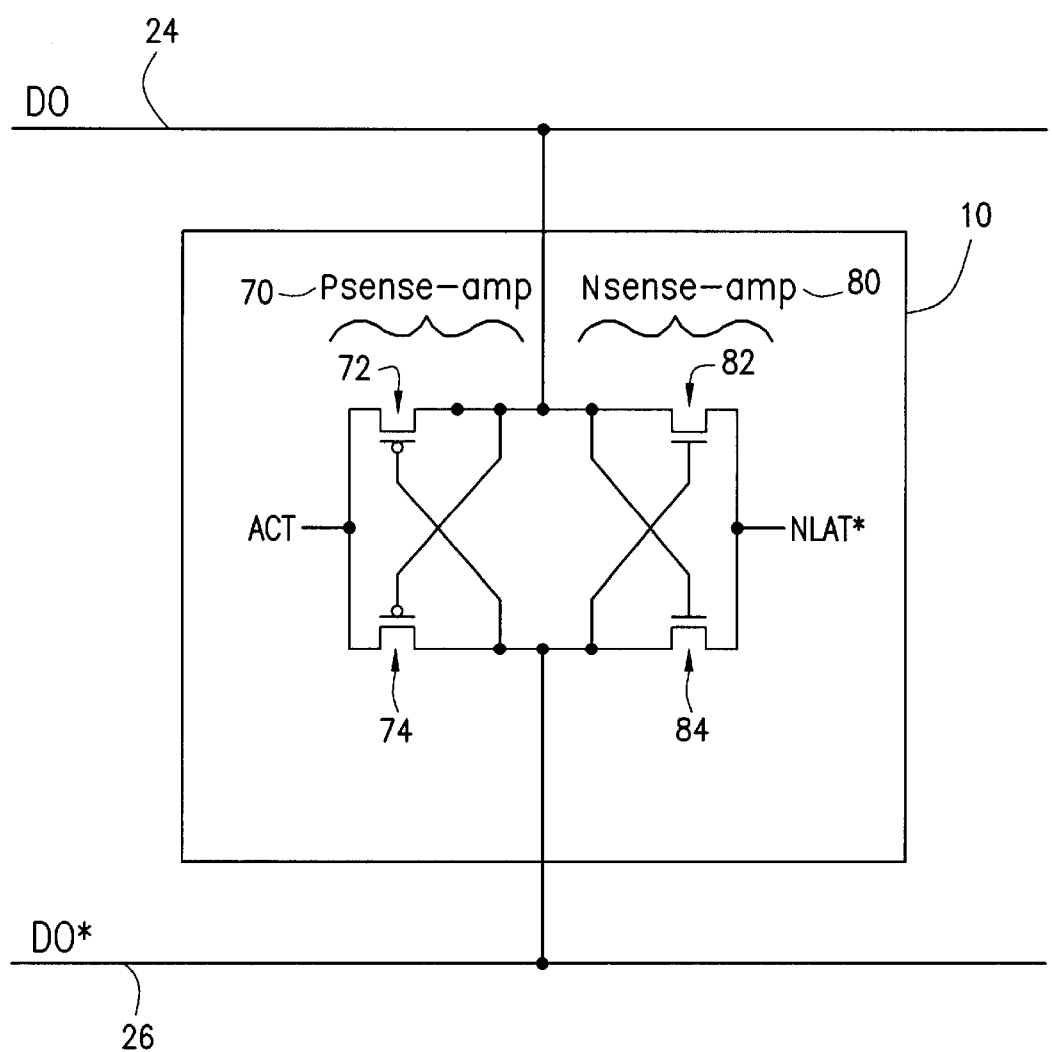
FIG. 2 illustrates a known scnse amplifier circuit utilized by the DRAM of FIG. 1.

The present invention will be described as set forth in the preferred embodiments illustrated in FIGS. 3–6. Other embodiments may be utilized and structural or logical changes may be made without departing from the spirit or scope of the present invention. Like items are referred to by like reference numerals.

In accordance with the present invention, a correlated double sampling sense amplifier for a DRAM device is provided that compensates for initial offsets caused by mismatches in transistors used for sensing the data on the bit lines.

Figure 3:
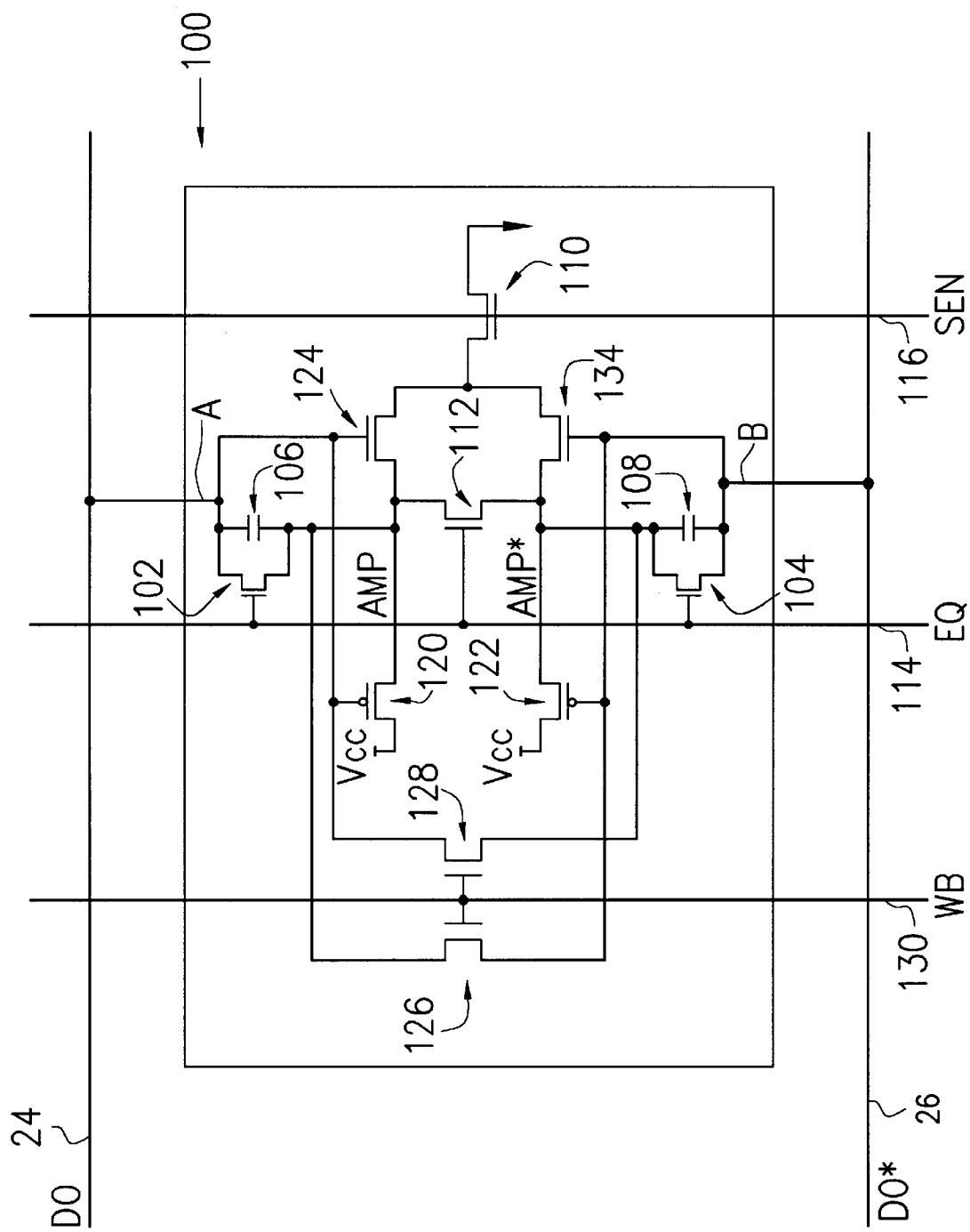
FIG. 3 illustrates a sense amplifier according to a first embodiment of the present invention.

FIG. 3 illustrates a sense amplifier circuit 100 in accordance with the present invention for use with DRAM device of FIG. 1. Circuit 100 includes NMOS transistors 102, 104 and 112 connected in series between the inputs/outputs, labeled A and B, of the sense amplifier 100. The inputs/outputs A and B are connected to digit lines D0 24 and D0* 26, respectively. The gate of each of transistor 102, 104 and 112 is connected to receive a reset signal EQ 114. A capacitor 106 is connected between the drain/source terminals of transistor 102, while a capacitor 108 is connected between the drain/source terminals of transistor 104.

The input/output node A is further connected to the gate of a transistor 124, and further to a first terminal of a transistor 128. The second terminal of transistor 128 is connected to the junction of transistor 104 and capacitor 108. Input/output node B is further connected to the gate of a transistor 134, and to a first terminal of transistor 126. The second terminal of transistor 126 is connected to the junction of transistor 102 and capacitor 106. The gate of each transistor 126, 128 is connected to receive a write back signal, WB 130.

A first terminal of transistors 124, 134 is connected to ground through transistor 110. The gate of transistor 110 is connected to receive a Sense signal, SEN 116. The second terminal of transistor 124, labeled AMP, is connected to a supply voltage Vcc through PMOS transistor 120, and further connected to the junction of transistor 102 and capacitor 106. The gate of transistor 120 is connected to the input/output node A. The second terminal of transistor 134, labeled AMP*, is connected to supply voltage Vcc through a PMOS transistor 122, and further connected to the junction of transistor 104 and capacitor 108. The gate of transistor 122 is connected to the input/output node B.

Figure 4:
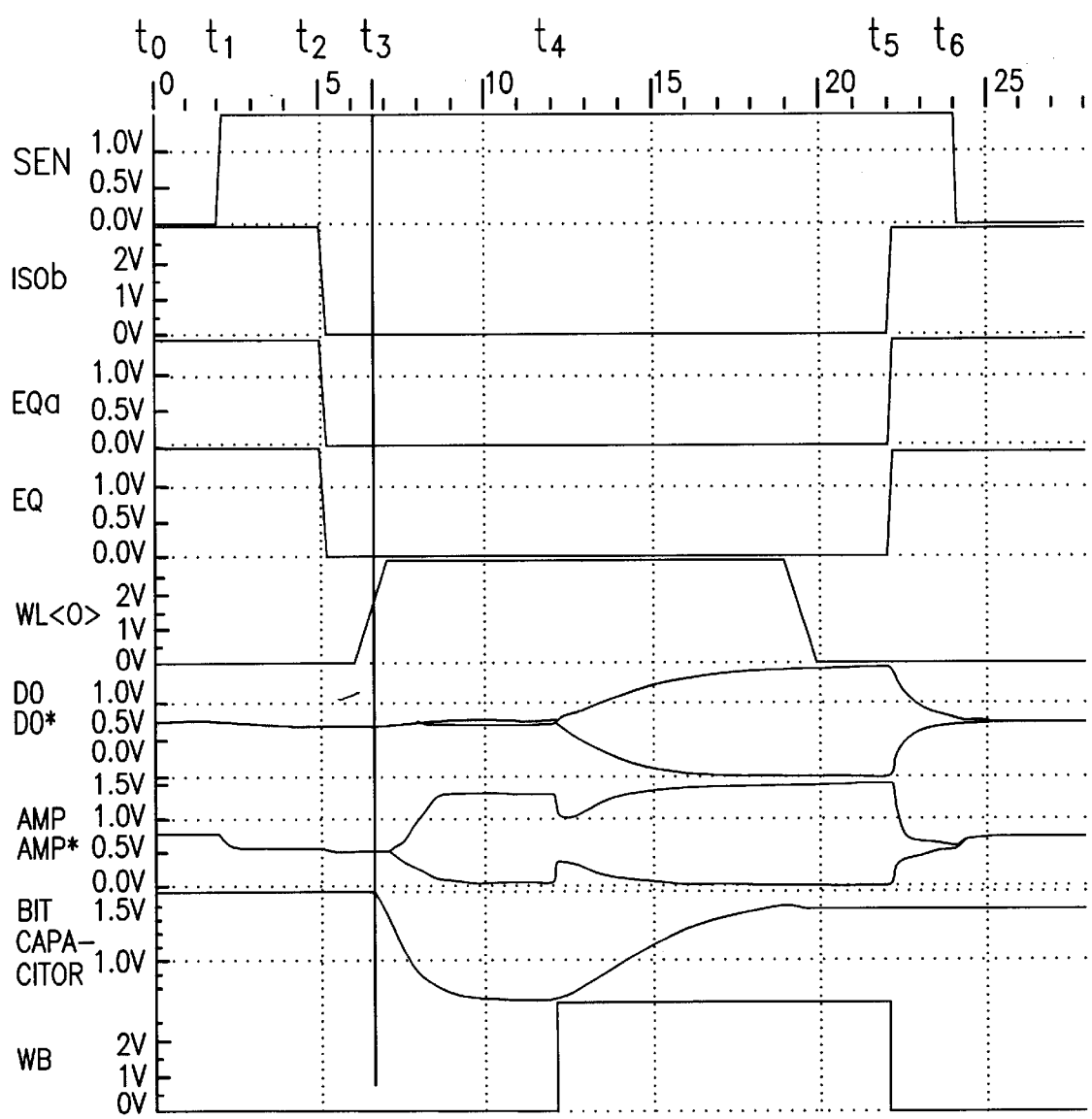
FIG. 4 illustrates a timing diagram for various signals of the circuit illustrated in FIG. 3.

The operation of the sense amplifier circuit 100 will be described with respect to the timing diagram illustrated in FIG. 4, which shows the levels of various signals of circuit 100 when an access operation occurs within the DRAM circuit of FIG. 1. For illustration purposes, assume a memory cell 21 of ARRAY 0 20 of FIG. 1 is to be accessed. At time $t_0$, the signals SEN 116 and WB 130 are low. The signals EQ 114, ISOa (not shown), ISOb, EQa and EQb are high. When signal EQ 114 is high, transistors 102, 104 and 112 are rendered conductive, thereby shorting capacitors 106 and 108 and providing a short between the inputs/outputs A, B of circuit 100. When the signal EQa is at a high logic level, equilibration circuit 50a effectively shorts digit line D0 24 to digit line D0* 26 such that both digit lines are equilibrated to the voltage Veq, typically Vcc/2.

At time $t_1$, the sense signal SEN 116 is driven high, thus making transistor 110 conductive and enabling the circuit 100 by connecting it to ground. Circuit 100 is typically disabled by keeping the sense signal SEN 116 low to reduce the amount of current drawn during standby.

At time $t_2$, the signals ISOb, EQa, and EQ 114 are driven low. When ISOb is driven low, transistors 34a, 34b will turn off, thus isolating ARRAY1 22 and equilibration circuit 50b from the sense amplifier circuit 100. When EQa is driven low, transistors 54, 56 and 58 of equilibration circuit 50a will turn off, thus isolating the digit lines D0 24 and D0* 26 from each other while maintaining the pre-charge level of Vcc/2. When EQ 114 is driven low, transistors 102, 104 and 112 will turn off, thus connecting the amplifier circuit, e.g., transistors 120, 124 and 122, 134 to the inputs/outputs A, B through capacitors 106, 108 respectively. Once the capacitors 106, 108 are coupled to the digit lines D0 24 and D0* 26 respectively (by EQ 114 being driven low), during a first sampling time the charge on the digit lines from the pre-charging by circuit 50a, i.e., Vcc/2, will be transferred to the capacitors 106, 108.

Between time $t_2$ and $t_3$, the signal on word line WL<0> will be driven high, thus activating the transistor in the memory cell 21. At time $t_3$, the charge stored in the bit capacitor of memory cell 21 will be transferred to the digit line D0 24, thus charging or discharging the bit capacitor. The voltage charge from the bit capacitor of memory cell 21 will add or subtract, depending upon the magnitude of the charge stored in the memory bit capacitor, from the voltage charge stored in the capacitor 106, thus providing a signal at node AMP equal to the magnitude of the change of the voltage on the capacitor 106, which will be approximately Vcc/2. A second sampling of the signals being input (nodes AMP and AMP*) to transistors 120, 124, 122, 134 will operate to drive nodes AMP and AMP* to Vcc and ground accordingly, depending upon which digit line D0 24 or D0* 26 has a higher potential with respect to the other. Thus for example, if digit line D0 24 is low and digit line D0* 26 is high, transistors 120 and 134 will turn on, thus driving the node AMP toward Vcc and the node AMP* toward ground respectively.

In accordance with the present invention, the double sampling of the signals on the digit lines D0 24 and D0* 26, i.e., before and after the signal from the bit capacitor of memory cell 21 is added to the digit line D0 24, makes the sense amplifier 100 immune to initial mismatches and offsets, since as noted above the signal on the digit line after the memory cell is accessed is the magnitude of the change of the voltage on the capacitor 106, which will be approximately Vcc/2.

At time $t_4$, the bit capacitor is approaching complete discharge and the write back signal WB 130 is driven high. When signal WB 130 goes high, transistors 126 and 128 become conductive, thereby connecting the inputs/outputs of sense amplifier circuit 100 to the opposite digit line to which it was originally connected, i.e., input/output A to the digit line D0* 26 through capacitor 108 and input/output B to the digit line D0 24 through capacitor 106. This is necessary as the output of sense amplifier 100 is inverted, unlike the output of sense amplifier 10 which is non-inverting. In the above example, when the inputs/outputs A, B are connected to the digit lines D0* 26 and D0 24 respectively, the digit lines D0 and D0* are driven to Vcc and ground respectively. Additionally at time $t_4$, the bit capacitor of memory cell 21 begins to recharge to its original level.

The logic state of the memory cell 21, as indicated by the signal level of digit lines D0 24 and D0* 26, can then be output from the DRAM on I/O lines 36, 38 when the column select signal CSEL is driven high. At time $t_5$, after the CSEL (not shown) has been driven high, signals ISOb, EQa and EQ 114 are driven high and signal WB 130 is driven low. At time $t_6$, the sense signal SEN 16 is driven low, thus disabling the sense amplifier circuit 100 until the next access operation occurs.

Thus, in accordance with the present invention, a correlated double sampling sense amplifier for a DRAM device is provided that compensates for initial offsets caused by mismatches in transistors used for sensing the data on the bit lines.

Figure 5:
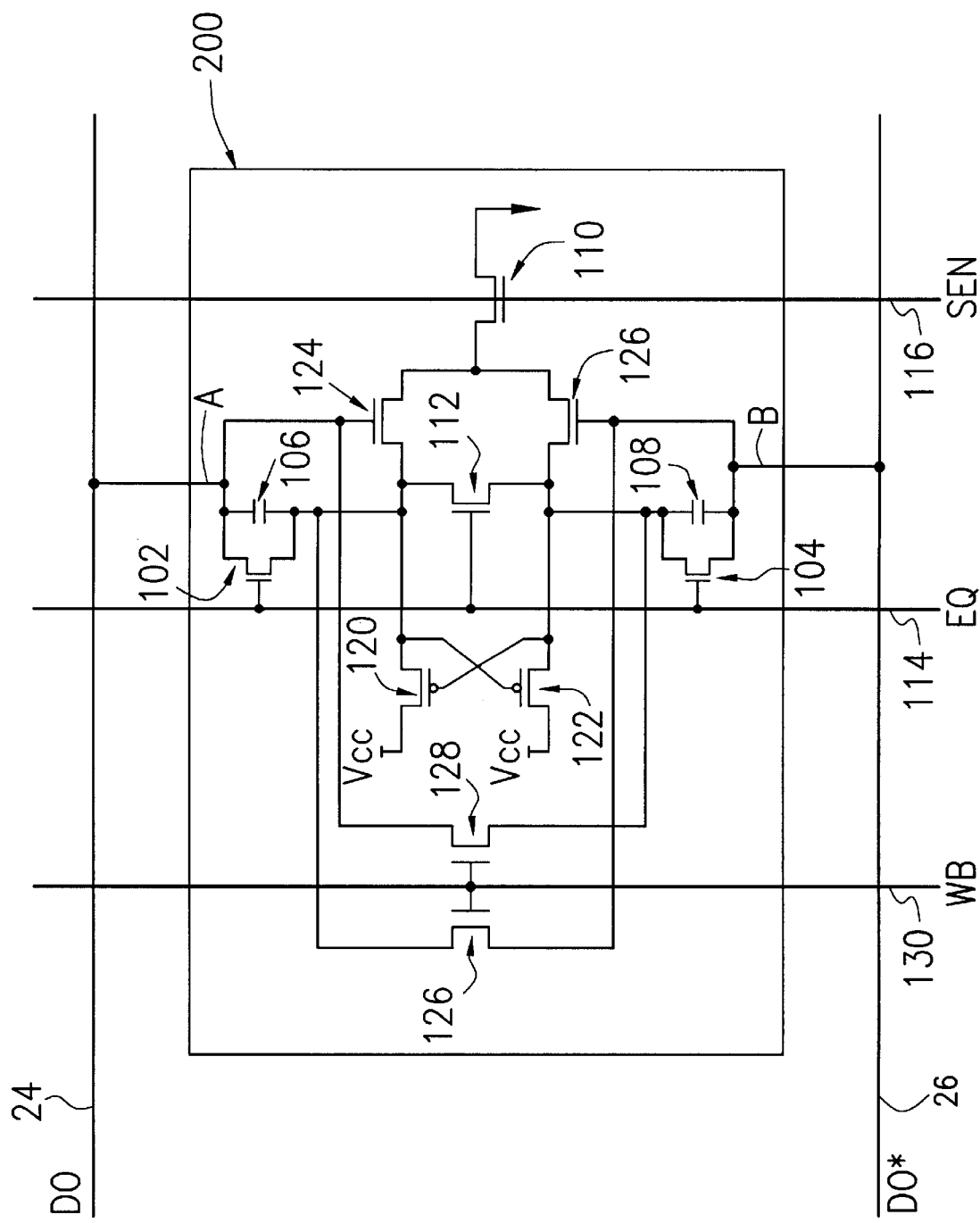
FIG. 5 illustrates a sense amplifier according to a second embodiment of the present invention.

FIG. 5 illustrates a sense amplifier circuit 200 in accordance with a second embodiment of the present invention. Sense amplifier 200 is similar to sense amplifier 100 except the PMOS transistors 120, 122 are cross coupled, as is known in the art, so that the response of one is determined in part by the response of the other. The operation of the circuit 200 is similar to that as described with respect to the operation of circuit 100, except the cross coupling of transistors 120, 122 provides a larger voltage swing at the inputs/outputs A, B.

Figure 6:
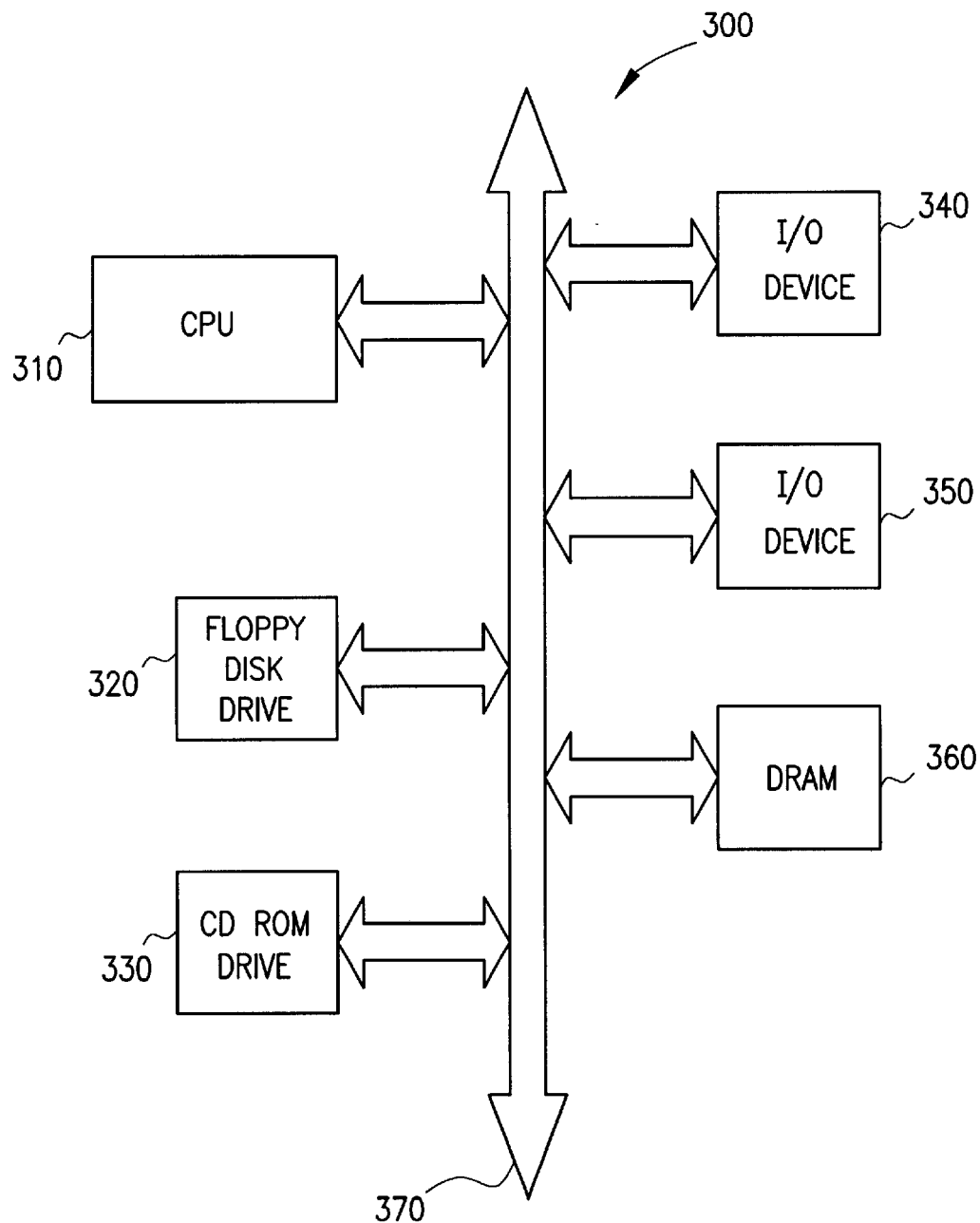
FIG. 6 illustrates in block diagram form a processor system that includes a DRAM having a sense amplifier in accordance with the present invention.

A typical processor based system which includes integrated circuits that utilize a sense amplifier according to the present invention is illustrated generally at 300 in FIG. 6. A computer system is exemplary of a system having integrated circuits, such as for example memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 310, for example, a microprocessor, that communicates with one or more input/output (I/O) devices 340, 350 over a bus 370. The computer system 300 also includes random access memory, such as DRAM 360, and, in the case of a computer system may include peripheral devices such as a floppy disk drive 320 and a compact disk (CD) ROM drive 330 which also communicate with CPU 310 over the bus 370. DRAM 360 is preferably constructed as an integrated circuit which includes a sense amplifier as previously described with respect to FIGS. 3–5. It may also be desirable to integrate the processor 310 and DRAM 360 on a single IC chip.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A sense amplifier comprising:
    an amplifier circuit having a first input/output and a second input/output;
    a first capacitor having a first terminal connected to said first input/output of said amplifier circuit and a second terminal connected to a first input/output of said sense amplifier, said first input/output of said sense amplifier adapted to be connected to a first digit line of a memory device and receive a first data signal representing data stored in said memory device;
    a second capacitor having a first terminal connected to said second input/output of said amplifier circuit and a second terminal connected to a second input/output of said sense amplifier, said second input/output of said sense amplifier adapted to be connected to a second digit line of said memory device and receive a second data signal representing a reference signal; and
    a first transistor having a first terminal connected to a first input of said amplifier circuit, a second terminal connected to a first power supply potential, and a gate terminal adapted to receive a first control signal, said first transistor in response to said first control signal enabling said sense amplifier,
    wherein said first and second data signals from said memory device are passed through said first and second capacitors, respectively, to said amplifier circuit.

2. The sense amplifier according to claim 1, wherein said first power supply potential is a ground potential.

3. The sense amplifier according to claim 1, further comprising:
    a second transistor having a first terminal connected to said first terminal of said first capacitor, a second terminal connected to said second terminal of said first capacitor, and a gate terminal;
    a third transistor having a first terminal connected to said first terminal of said second capacitor, a second terminal connected to said second terminal of said second capacitor, and a gate terminal; and
    a fourth transistor having a first terminal connected to said first terminal of said first capacitor, a second terminal connected to said first terminal of said second capacitor, and a gate terminal,
    said gate terminal of said second, third and fourth transistor adapted to receive a second control signal and in response to said second control signal provide a conductive link between said first input/output of said sense amplifier and said second input/output of said sense amplifier.

4. The sense amplifier according to claim 3, further comprising:
    a fifth transistor having a first terminal connected to said first terminal of said first capacitor, a second terminal connected to said second input/output of said sense amplifier, and a gate terminal; and
    a sixth transistor having a first terminal connected to said first terminal of said second capacitor, a second terminal connected to said first input/output of said sense amplifier, and a gate terminal,
    said gate terminal of said fifth and sixth transistor adapted to receive a third control signal and in response to said third control signal connecting said first input/output of said amplifier circuit to said second input/output of said sense amplifier and said second input/output of said amplifier circuit to said first input/output of said sense amplifier.

5. The sense amplifier according to claim 4, wherein said amplifier circuit further comprises:
    a first NMOS transistor having a first terminal connected to said first terminal of said first transistor, a second terminal connected to said first terminal of said first capacitor, and a gate terminal connected to said second terminal of said first capacitor;
    a second NMOS transistor having a first terminal connected to said first terminal of said first transistor, a second terminal connected to said first terminal of said second capacitor, and a gate terminal connected to said second terminal of said second capacitor;
    a first PMOS transistor having a first terminal connected to said first terminal of said first capacitor, a second terminal connected to a second power supply potential, and a gate terminal; and
    a second PMOS transistor having a first terminal connected to said first terminal of said second capacitor, a second terminal connected to said second power supply potential, and a gate terminal.

6. The sense amplifier according to claim 5, wherein said gate terminal of said first PMOS transistor is connected to said second terminal of said first capacitor and said gate terminal of said second PMOS transistor is connected to said second terminal of said second capacitor.

7. The sense amplifier according to claim 5, wherein said gate terminal of said first PMOS transistor is connected to said first terminal of said second capacitor and said gate terminal of said second PMOS transistor is connected to said first terminal of said first capacitor.

8. The sense amplifier according to claim 5, where said second power supply potential is Vcc.

9. A sense amplifier for a memory device comprising:
    an amplifier circuit having a first input/output and a second input/output;
    a first capacitor having a first terminal connected to said first input/output of said amplifier circuit and a second terminal adapted to be connected to a first digit line of said memory device; and
    a second capacitor having a first terminal connected to said second input/output of said amplifier circuit and a second terminal adapted to be connected to a second digit line of said memory device;
    wherein in response to an enabling control signal said sense amplifier samples a signal level on said first and second digit lines before a memory cell of said memory device associated with said first and second digit lines is accessed, stores said sampled signal in said first and second capacitor, and samples a second signal on said first and second digit lines after said memory cell is accessed.

10. The sense amplifier according to claim 9, further comprising:
a first transistor having a first terminal connected to an input of said amplifier circuit, a second terminal connected to a first power supply potential, and a gate terminal adapted to receive said enabling control signal, said first transistor in response to said enabling control signal enabling said sense amplifier.

11. The sense amplifier according to claim 10, wherein said first power supply potential is a ground potential.

12. The sense amplifier according to claim 10, further comprising:
a second transistor having a first terminal connected to said first terminal of said first capacitor, a second terminal connected to said second terminal of said first capacitor, and a gate terminal;
a third transistor having a first terminal connected to said first terminal of said second capacitor, a second terminal connected to said second terminal of said second capacitor, and a gate terminal; and
a fourth transistor having a first terminal connected to said first terminal of said first capacitor, a second terminal connected to said first terminal of said second capacitor, and a gate terminal,
said gate terminal of said second, third and fourth transistor adapted to receive a second control signal and in response to said second control signal provide a conductive link between said first digit line and said second digit line of said memory device.

13. An integrated circuit comprising:
a sense amplifier, said sense amplifier comprising:
an amplifier circuit having a first input/output and a second input/output;
a first capacitor having a first terminal connected to said first input/output of said amplifier circuit and a second terminal connected to a first input/output of said sense amplifier, said first input/output of said sense amplifier adapted to be connected to a first digit line of a memory device and receive a first data signal representing data stored in said memory device;
a second capacitor having a first terminal connected to said second input/output of said amplifier circuit and a second terminal connected to a second input/output of said sense amplifier, said second input/output of said sense amplifier adapted to be connected to a second digit line of said memory device and receive a second data signal representing a reference signal; and
a first transistor having a first terminal connected to a first input of said amplifier circuit, a second terminal connected to a first power supply potential, and a gate terminal adapted to receive a first control signal, said first transistor in response to said first control signal enabling said sense amplifier,
wherein said first and second data signals from said memory device are passed through said first and second capacitors, respectively, to said amplifier circuit.

14. The integrated circuit according to claim 13, wherein said first power supply potential is a ground potential.

15. The integrated circuit according to claim 13, wherein said sense amplifier further comprises:

a second transistor having a first terminal connected to said first terminal of said first capacitor, a second terminal connected to said second terminal of said first capacitor, and a gate terminal;
a third transistor having a first terminal connected to said first terminal of said second capacitor, a second terminal connected to said second terminal of said second capacitor, and a gate terminal; and
a fourth transistor having a first terminal connected to said first terminal of said first capacitor, a second terminal connected to said first terminal of said second capacitor, and a gate terminal,
said gate terminal of said second, third and fourth transistor adapted to receive a second control signal and in response to said second control signal provide a conductive link between said first input/output of said sense amplifier and said second input/output of said sense amplifier.

16. The integrated circuit according to claim 15, said sense amplifier further comprising:
a fifth transistor having a first terminal connected to said first terminal of said first capacitor, a second terminal connected to said second input/output of said sense amplifier, and a gate terminal; and
a sixth transistor having a first terminal connected to said first terminal of said second capacitor, a second terminal connected to said first input/output of said sense amplifier, and a gate terminal,
said gate terminal of said fifth and sixth transistor adapted to receive a third control signal and in response to said third control signal connecting said first input/output of said amplifier circuit to said second input/output of said sense amplifier and said second input/output of said amplifier circuit to said first input/output of said sense amplifier.

17. The integrated circuit according to claim 16, wherein said amplifier circuit further comprises:
a first NMOS transistor having a first terminal connected to said first terminal of said first transistor, a second terminal connected to said first terminal of said first capacitor, and a gate terminal connected to said second terminal of said first capacitor;
a second NMOS transistor having a first terminal connected to said first terminal of said first transistor, a second terminal connected to said first terminal of said second capacitor, and a gate terminal connected to said second terminal of said second capacitor;
a first PMOS transistor having a first terminal connected to said first terminal of said first capacitor, a second terminal connected to a second power supply potential, and a gate terminal; and
a second PMOS transistor having a first terminal connected to said first terminal of said second capacitor, a second terminal connected to said second power supply potential, and a gate terminal.

18. The integrated circuit according to claim 17, wherein said gate terminal of said first PMOS transistor is connected to said second terminal of said first capacitor and said gate terminal of said second PMOS transistor is connected to said second terminal of said second capacitor.

19. The integrated circuit according to claim 17, wherein said gate terminal of said first PMOS transistor is connected to said first terminal of said second capacitor and said gate terminal of said second PMOS transistor is connected to said first terminal of said first capacitor.

20. The integrated circuit according to claim 17, where said second power supply potential is Vcc.

21. The integrated circuit according to claim 13, wherein said integrated circuit is a memory device.

22. A memory device comprising:
   a plurality of memory cells arranged in rows and columns;
   a plurality of pairs of digit lines, each of said plurality of pairs of digit lines being associated with at least one of said plurality of memory cell; and
   a plurality of sense amplifiers, each of said plurality of sense amplifiers having a first input/output and a second input/output connected between a respective pair of digit lines, each of said plurality of sense amplifiers comprising:
      an amplifier circuit having a first input/output and a second input/output;
      a first capacitor having a first terminal connected to said first input/output of said amplifier circuit and a second terminal connected to a first digit line of said respective pair of digit lines;
      a second capacitor having a first terminal connected to said second input/output of said amplifier circuit and a second terminal connected to a second digit line of said respective pair of said digit lines; and
      a first transistor having a first terminal connected to a first input of said amplifier circuit, a second terminal connected to a first power supply potential, and a gate terminal adapted to receive a first control signal, said first transistor in response to said first control signal enabling said sense amplifier,
      wherein said first and second digit lines pass signals representing a charge stored in said associated one of said plurality of memory cells through said first and second capacitors, respectively, to said amplifier circuit.

23. The memory device according to claim 22 wherein said first power supply potential is a ground potential.

24. The memory device according to claim 22, each of said sense amplifiers further comprising:
   a second transistor having a first terminal connected to said first terminal of said first capacitor, a second terminal connected to said second terminal of said first capacitor, and a gate terminal;
   a third transistor having a first terminal connected to said first terminal of said second capacitor, a second terminal connected to said second terminal of said second capacitor, and a gate terminal; and
   a fourth transistor having a first terminal connected to said first terminal of said first capacitor, a second terminal connected to said first terminal of said second capacitor, and a gate terminal,
   said gate terminal of said second, third and fourth transistor adapted to receive a second control signal and in response to said second control signal provide a conductive link between said first and second digit line of said respective pair of digit lines.

25. The memory device according to claim 24, each of said sense amplifiers further comprising:
   a fifth transistor having a first terminal connected to said first terminal of said first capacitor, a second terminal connected to said second digit line, and a gate terminal; and
   a sixth transistor having a first terminal connected to said first terminal of said second capacitor, a second terminal connected to said first digit line, and a gate terminal,
   said gate terminal of said fifth and sixth transistor adapted to receive a third control signal and in response to said third control signal connecting said first terminal of said first capacitor to said second digit line and said first terminal of said second capacitor to said first digit line.

26. The memory device according to claim 25, wherein said amplifier circuit further comprises:
   a first NMOS transistor having a first terminal connected to said first terminal of said first transistor, a second terminal connected to said first terminal of said first capacitor, and a gate terminal connected to said second terminal of said first capacitor;
   a second NMOS transistor having a first terminal connected to said first terminal of said first transistor, a second terminal connected to said first terminal of said second capacitor, and a gate terminal connected to said second terminal of said second capacitor;
   a first PMOS transistor having a first terminal connected to said first terminal of said first capacitor, a second terminal connected to a second power supply potential, and a gate terminal; and
   a second PMOS transistor having a first terminal connected to said first terminal of said second capacitor, a second terminal connected to said second power supply potential, and a gate terminal.

27. The memory device according to, claim 26, wherein said gate terminal of said first PMOS transistor is connected to said second terminal of said first capacitor and said gate terminal of said second PMOS transistor is connected to said second terminal of said second capacitor.

28. The memory device according to claim 26, wherein said gate terminal of said first PMOS transistor is connected to said first terminal of said second capacitor and said gate terminal of said second PMOS transistor is connected to said first terminal of said first capacitor.

29. The memory device according to claim 26, where said second power supply potential is Vcc.

30. A memory device comprising:
   a plurality of memory cells arranged in rows and columns;
   a plurality of pairs of digit lines, each of said plurality of pairs of digit lines being associated with at least one of said plurality of memory cells; and
   a plurality of sense amplifiers, each of said plurality of sense amplifiers being connected between a respective pair of digit lines, each of said plurality of sense amplifiers comprising:
      an amplifier circuit having a first input/output and a second input/output;
      a first capacitor having a first terminal connected to said first input/output of said amplifier circuit and a second terminal connected to a first digit line of said respective pair of digit lines; and
      a second capacitor having a first terminal connected to said second input/output of said amplifier circuit and a second terminal connected to a second digit line of said respective pair of digit lines;
   wherein in response to an enabling control signal said sense amplifier samples a signal level on said first and second digit lines before a memory cell of said memory device associated with said first and second digit lines is accessed, stores said sampled signal in said first and second capacitor, and samples a second signal on said first and second digit lines after said memory cell is accessed.

31. The memory device according to claim 30, wherein said sense amplifier further comprises:
   a first transistor having a first terminal connected to an input of said amplifier circuit, a second terminal connected to a first power supply potential, and a gate terminal adapted to receive said enabling control signal, said first transistor in response to said enabling control signal enabling said sense amplifier.

32. The memory device according to claim 31, wherein said first power supply potential is a ground potential.

33. The memory device according to claim 31, wherein said sense amplifier further comprises:
   a second transistor having a first terminal connected to said first terminal of said first capacitor, a second terminal connected to said second terminal of said first capacitor, and a gate terminal;
   a third transistor having a first terminal connected to said first terminal of said second capacitor, a second terminal connected to said second terminal of said second capacitor, and a gate terminal; and
   a fourth transistor having a first terminal connected to said first terminal of said first capacitor, a second terminal connected to said first terminal of said second capacitor, and a gate terminal,
   said gate terminal of said second, third and fourth transistor adapted to receive a second control signal and in response to said second control signal provide a conductive link between said first digit line and said second digit line of said respective pair of digit lines.

34. A processor system comprising:
   a central processing unit; and
   a memory device connected to said processing unit to receive data from and supply data to said central processing unit:, said memory device comprising:
      a plurality of memory cells arranged in rows and columns;
      a plurality of pairs of digit lines, each of said plurality of pairs of digit lines being associated with at least one of said plurality of memory cells; and
      a plurality of sense amplifiers, each of said plurality of sense amplifiers having a first input/output connected to a first digit line of said respective pair of digit lines and a second input/output connected to a second of said respective pair of digit lines, each of said plurality of sense amplifiers comprising:
         an amplifier circuit having a first input/output and a second input/output;
         a first capacitor having a first terminal connected to said first input/output of said amplifier circuit and a second terminal connected to said first input/output of said sense amplifier;
         a second capacitor having a first terminal connected to said second input/output of said amplifier circuit and a second terminal connected to said second input/output of said sense amplifier; and
         a first transistor having a first terminal connected to a first input of said amplifier circuit, a second terminal connected to a first power supply potential, and a gate terminal adapted to receive an enable control signal, said first transistor in response to said enable control signal enabling said sense amplifier,
      wherein signals representing a charge stored in said associated memory cell are conducted by said first and second digit lines, and passed through said first and second capacitors, respectively, to said amplifier circuit.

35. The processor system according to claim 34 wherein said first power supply potential is a ground potential.

36. The processor system according to claim 34, each of said sense amplifiers further comprising:
   a second transistor having a first terminal connected to said first terminal of said first capacitor, a second terminal connected to said second terminal of said first capacitor, and a gate terminal;
   a third transistor having a first terminal connected to said first terminal of said second capacitor, a second terminal connected to said second terminal of said second capacitor, and a gate terminal; and
   a fourth transistor having a first terminal connected to said first terminal of said first capacitor, a second terminal connected to said first terminal of said second capacitor, and a gate terminal,
   said gate terminal of said second, third and fourth transistor adapted to receive a second control signal and in response to said second control signal provide a conductive link between said first and second digit line of said respective pair of digit lines.

37. The processor system according to claim 36, each of said sense amplifiers further comprising:
   a fifth transistor having a first terminal connected to said first terminal of said first capacitor, a second terminal connected to said second digit line, and a gate terminal; and
   a sixth transistor having a first terminal connected to said first terminal of said second capacitor, a second terminal connected to said first digit line, and a gate terminal,
   said gate terminal of said fifth and sixth transistor adapted to receive a third control signal and in response to said third control signal connecting said first terminal of said first capacitor to said second digit line and said first terminal of said second capacitor to said first digit line.

38. The processor system according to claim 37 wherein said amplifier circuit further comprises:
   a first NMOS transistor having a first terminal connected to said first terminal of said first transistor, a second terminal connected to said first terminal of said first capacitor, and a gate terminal connected to said second terminal of said first capacitor;
   a second NMOS transistor having a first terminal connected to said first terminal of said first transistor, a second terminal connected to said first terminal of said second capacitor, and a gate terminal connected to said second terminal of said second capacitor;
   a first PMOS transistor having a first terminal connected to said first terminal of said first capacitor, a second terminal connected to a second power supply potential, and a gate terminal; and
   a second PMOS transistor having a first terminal connected to said first terminal of said second capacitor, a second terminal connected to said second power supply potential, and a gate terminal.

39. The processor system according to claim 38, wherein said gate terminal of said first PMOS transistor is connected to said second terminal of said first capacitor and said gate terminal of said second PMOS transistor is connected to said second terminal of said second capacitor.

40. The processor system according to claim 38, wherein said gate terminal of said first PMOS transistor is connected to said first terminal of said second capacitor and said gate terminal of said second PMOS transistor is connected to said first terminal of said first capacitor.

41. The processor system according to claim 38, where said second power supply potential is Vcc.

42. The processor system according to claim 34, wherein said central processing unit and said memory device are on a single chip.

43. A method for sensing a stored charge of a memory cell comprising:
   sampling a first signal level on a first digit line associated with said memory cell;
   storing said sampled signal level;

accessing said memory cell;

transferring said stored charge from said memory cell to said first digit line;

sampling a second signal level on said first digit line, said second signal level being based on said first signal level and said stored charge from said memory cell, said second signal level creating a voltage differential between said first digit line and a second digit line; and amplifying said voltage differential to determine said stored charge of said memory cell.

44. The method according to claim 43, wherein before said step of sampling a first signal level, said method further comprises:

supplying a control signal to enable a sense amplifier circuit for sensing said stored charge of said memory cell.

45. The method according to claim 43, wherein before said step of sampling a first signal level, said method further comprises:

connecting said first digit line to said second digit line; and equilibrating said first digit line and said second digit line to a predetermined voltage.

46. The method according to claim 45, wherein said predetermined voltage is Vcc/2.

47. The method according to claim 43, further comprising:

outputting said amplified voltage differential on said first and second digit lines.

48. The method according to claim 47, wherein before said step of outputting, said method further comprises:

inverting said amplified voltage differential.

* * * * *